United States Patent [19]
Cameron

[11] Patent Number: 6,133,747
[45] Date of Patent: Oct. 17, 2000

[54] TIME REDUNDANT RADIATION TOLERANT LOGIC

[75] Inventor: Kelly Cameron, Irvine, Calif.

[73] Assignee: University of New Mexico, Albuquerque, N. Mex.

[21] Appl. No.: 09/120,894

[22] Filed: Jul. 22, 1998

Related U.S. Application Data

[60] Provisional application No. 60/053,448, Jul. 22, 1997.

[51] Int. Cl.$^7$ .................................................. H03K 19/003
[52] U.S. Cl. .................................. 326/9; 326/10; 714/819
[58] Field of Search .................................... 326/9, 10, 26, 326/27, 82, 86, 90; 714/819, 820, 821, 822

[56] References Cited

U.S. PATENT DOCUMENTS

| | | | |
|---|---|---|---|
| 4,162,480 | 7/1979 | Berlekamp | 340/146.1 |
| 4,541,067 | 9/1985 | Whitaker | 364/716 |
| 4,587,627 | 5/1986 | Omura et al. | 364/754 |
| 4,873,688 | 10/1989 | Maki et al. | 371/37.1 |
| 5,111,429 | 5/1992 | Whitaker | 365/156 |
| 5,204,841 | 4/1993 | Chappell et al. | 365/230.05 |
| 5,406,513 | 4/1995 | Canaris et al. | 365/181 |
| 5,418,473 | 5/1995 | Canaris | 326/27 |
| 5,481,555 | 1/1996 | Wade et al. | 371/57.2 |
| 5,870,332 | 2/1999 | Lahey et al. | 365/156 |

OTHER PUBLICATIONS

Advanced Hardware Architecture: AHA 4510 High Speed Reed Solomon Encode/Decoder Data Sheet, 1989.

R. Bose and D. Ray–Chaudhuri, "On a class of Enter Correcting Binary Group Codes,"Inf. and Control, 3, pp. 68–79, 1960.

*CCSDS recommendation for Telemetry Channel Coding,* CCSDS Secretariat, Communications and Data Systems Division, Code–TS, NASA, 1984.

R. Chein, "Cyclic Decoding Procedures for the Bose–Chaudhuri–Hocquenghem Codes," IEEE Trans. Information Theory, IT–10, pp. 357–363, Oct. 1964.

N. Demassieux, F. Jutand, and M. Muller, "A 10Mhz (255, 223) Reed–Solomon Decoder," IEEE 1988 Custom Integrated Circuits Conference, pp. 17.6.1–17.6.4, May 1998.

G. Feng, "A VSLI Architecture for Fast Inversion in GF($2^m$)," IEEE Trans. on Computer, vol. 38, No. 10, pp. 1383–1386, Oct. 1989.

T. Fujio, "A Study of High–Definition TV System in the Future," IEee Trans. Broadcast, vol BC–24, No. 4, pp. 347–350, 1983.

A. Hilman and G. Alexanderson, *A First Under–Graduate Course in Abstract Algebra*, Wadsworth Publishing, pp. 347–350, 1983.

B.A. Laws, Jr. and C.K. Rushforth, "A Cellular–Array Multipler for GF($2^m$), " IEEE Trans. on Computers, vol. C–20, pp. 1573–1578, Dec. 1971.

G. Meeker,"High Definition and High Frame Rate Compatible N.T.S.C. Broadcast Television System," IEEE Trans. Broadcast, vol. 34, No. 3, pp. 313–322, Sept. 1988.

(List continued on next page.)

*Primary Examiner*—Michael Tokar
*Assistant Examiner*—Anh Tran
*Attorney, Agent, or Firm*—Haverstock & Owens LLP

[57] ABSTRACT

The present invention provides an SEU immune solution which minimizes the disadvantages of the increased weight and size of prior art SEU immune circuits. In the present invention, the SEU immune solution can comprise two portions. First, a control portion can be comprised of SEU tolerant electronics as described in the prior art. A processor comprises the second portion and is preferably not SEU immune. The present invention makes it unnecessary for both portions of the circuit to be comprised of SEU tolerant logic in order for the output of the present invention to be SEU tolerant. In particular, the present invention is especially well suited for outer space travel since the present invention will not be upset by SEUs and retains a small package size and light weight.

18 Claims, 8 Drawing Sheets

OTHER PUBLICATIONS

B. Mortimer, M. Moore, and Sablatash, "Performance of a Powerful Error–Correcting and Detecting Coding Scheme for the North American Basic Teletext System (NABTS) for Random Indepent Errors: Methods, Equations, Calculations, And Results," IEEE Trans. Broadcast, vol. 36, No. 2, pp. 113–131, Jun. 1990.

I. Reed and G. Solomon, "Polynomial Codes over Certain Finite Fields,"J. Soc. Industrial Applied Mathematics, vol. 8, No. 2, pp. 300–304, Jun. 1996.

H. Shao and I. Reed, "on the VLSI Design of a Pipeline Reed–Solomon Decoder Using Systolic Arrays," IEEE Transactions on Computers, vol. 37, No. 10, pp. 1273–1280, Oct. 1988.

Y. Sugiyama, M. Kasahara, S. Hirasawa, and T. Namekawa, "A Method for Solving Key Equation for Decoding Goppa Codes," Inf. Control, 27, pp. 87–99, 1975.

C. Wang, T. Troung, H. Shao, L. Deutsch, and J. Omura, "VSLI Architectures for Computing Multiplications and Inverses in $GF(2^m)$," IEEE Transactions on Computers, vol. C–34, No. 8, pp. 709–717, Aug. 1985.

S. Whitaker, J. Canaris, and P. Owlsey, "Custom CMOS Reed–Solomon Coder for the Hubble Space Telescope," Proceedings of the IEEE Military Communications Conference, Monterey, CA, pp. 4.3.1–4.3.5, Oct. 1990.

S. Whitaker, J. Canaris, and K. Cameron, "Reed–Solomon VSLI Code for Advanced Television", IEEE Transactions on Circuits and Systems for Video Technology, pp. 1–21, Jun. 1991.

C. Yeh, I. Reed, T. Troung, "Systolic Multipliers for Finite Fields $GF(2^m)$", IEEE Transactions on Computers, vol. C–33, pp. 357–360, Apr. 1984.

Digital Spectrum Compatible, Technical Description, Zenith Electronic Corporation and AT&T, Feb. 22, 1991.

K. Niwa, T. Araseki, T. Nishitani, "Digital Signal Processing for Video," IEEE Circuits and Devices Magazine, vol. 6, No. 1, pp. 27–32, Jan. 1990.

H. Cha, E. Rudnick, J. Patel, R. Iyer and G. Choi," A Gate–Level Simulation Environment for Alpha–Particle–Induced Transient Faults," IEEE Transactions on Computers, vol. 45, No. 11, pp. 1248–1256, Nov. 1996.

J.F. Leavy, L. F. Hoffmann, R.W. Shovan and M. T. Johnson, "Upset Due To A Single Particle Caused Propagated Transient In A Bulk CMOS Microprocessor," IEEE Transactions on Nuclear Science, vol. 38, No. 6, pp. 1493–1499, Dec. 1991.

R. Schneiderwind, D. Krening, S. Buchner, K. Kang and T. R. Weatherford, "Laser Confirmation of SEU Experiments in GaAs MESFET Combinational Logic" IEEE Transactions on Nuclear Science, vol. 39, No. 6, pp. 1665–1670, Dec. 1992.

R. A. Reed, M. A. Carts, P. W. Marshall, C. J. Marshall, S. Buchner, M. La Macchia, B. Mathes and D. McMorrow, "Single Event Upset Cross Sections At Various Data Rates," IEEE Transactions on Nuclear Science, vol. 43, No. 6, pp. 2862–2867, Dec. 1996.

S. Buchner, M. Baze, D. Brown, D. McMorrow and J. Melinger, "Comparison of Error Rates in Combinational and Sequential Logic, " IEEE Transactions Nuclear Science, vol. 44, No. 6, pp. 2209–2216, Dec. 1997.

P.E. Dodd, F. W. Sexton, M.R. Shaneyfelt, B. L. Draper A. J. Farino and R. S. Flores, "Impact of Technology Trends on SEU in CMOS SRAMS," IEEE Transactions on Nuclear Science, vol. 43, No. 6 pp. 2797–2804, Dec. 1996.

S. Whitaker, J. Canaris and K. Liu, "SEU Hardened Memory Cells For A CCSDS Reed Solomon Encoder," IEEE Transactions on Nuclear Science, vol. 38, No. 6, pp. 1471–1477, Dec. 1991.

M. N. Liu and S. Whitaker, "Low Power SEU Immune CMOS Memory Circuits," IEEE Transactions on Nuclear Science, vol. 39, No. 6, pp. 1679–1684, Dec. 1992.

J. Canaris and S, Whitaker, "Circuits Techniques for the Radiation Environment of Space," IEEE 1995 Customer Intergrated Circuits Conference, pp. 77–80, 1995.

J. Gambles and G. Maki, "RAD–Tolernat Flight VLSI From Commerical Foundries,"Proceedings of the 39th Midwest Symposium on Circuits and Systems, pp. 1227–1230, Aug. 18–21, 1996.

F. W. Sexton et al., "SEU Simulation and Testing of Resistor–Hardened D–Latches in the SA3300 Microprocessor, "IEEE Transactions on Nuclear Science, vol. 38, No. 6, pp. 1521–1528, Dec. 1991.

Y. Savaria, N. Rumin, J. Hayes and V. Agarwal, "Soft–Error Filtering: A Solution to the Reliablity Problem of Future VLSI Digital Circuits," Proceeding of the IEEE , vol. 74, No. 5, pp. 669–683, 1986.

M. P. Baze and S. P. Buchner, "Attentnuation of Single Event Induced Pulses in CMOS Combination Logic," IEEE Transaction on Nuclear Science, vol. 44, No. 6, pp. 2217–2222, Dec. 1997.

P. Liden, P. Dahlgren, R. Johansson and J. Karlsson, "On Latching Probability of Particle Induced Transients in Combinational Networks," IEEE Computer Society Press, 24th International Symposium on Fault–Tolerant Computing, pp. 340–349, Jun. 15–17, 1994.

K. J. Haas and J. W. Gambles, "Single Event Transients in Deep Submicron CMOS,"42nd Midwest Symposium on Circuits and Systems, Aug. 1999.

K. Joe Haas, Jody Gambles, Bill walker and Mike Zampaglione, "Mitigating Single Event Upstes From Combinational Logic," 7th NASA Symposium on VLSI Design, pp. 4.1.1–4.1.10, 1998.

S.M. Kang and D. Chu, "CMOS Circuit Design for Prevention of Single Event Upset," International Conference on Computer Design, 1986.

T. Ma and P. Dressendorfer, *Ionizing Radiation Effects in CMOS Devices and Circuits*, Chapter 9, pp. 484–576, 1989.

TIME REDUNDANT RADIATION TOLERANT LOGIC

RELATED APPLICATIONS

This application claims priority under 35 U.S.C. § 119(e) of the co-pending U.S. provisional application Ser. No. 60/053,448 filed on Jul. 22, 1997 and entitled "TIME REDUNDANT RADIATION TOLERANT LOGIC." The provisional application Ser. No. 60/053,448 filed on Jul. 22, 1997 and entitled "TIME REDUNDANT RADIATION TOLERANT LOGIC" is also hereby incorporated by reference.

FIELD OF THE INVENTION

The present invention broadly relates to the field of single event upset immune circuits. More particularly, this invention relates to circuits that through a carefully selected combination of time redundancy and radiation tolerant logic can recover from a single event upset and can prevent glitch propagation from an upset node. Furthermore, this invention relates to circuits which are more compact and contain fewer components than conventional radiation tolerant logic while still providing the same single event upset protection.

BACKGROUND TO THE INVENTION

Semiconductor memory cells are well known and have been used extensively for many years to store a binary bit of data as a "1" or a "0". Digital circuits and logic families have also been extensively used to perform functions on bits of binary data. Unfortunately, the data bit stored in the cell or processed within the digital circuit can be corrupted if the cell or circuit is exposed to an ionized particle such as an alpha particle, T, Ma, and P. Dressendorfer, *Ionizing Radiation Effects in CMOS Devices & Circuits*, New York, N.Y., John Wiley & Sons, 1989, Chapter 9. It is known that single event upsets (SEU) can occur due to a charged particle striking the cell or circuit. Further, in outer space, cosmic ions are abundant and are the principle source of SEUs in memory cells and circuits. The heavier ions have higher linear energy transfer compared to lighter ions. Accordingly, the stored data bit is more likely to be corrupted in an environment bombarded with heavy ionized particles.

The hardware in which the data is stored in memory cells and processed within digital circuits on satellites and spacecraft travelling in outer space needs to meet two important criteria. First, safeguarding the integrity of the stored and calculated data is critical because often data collected while in space is not easily duplicated, and the accuracy of the calculated data on a satellite or spacecraft is crucial to a space mission's success. Therefore, the hardware used to store and calculate the data must be SEU immune. Second, SEU immune hardware solution utilized in satellites and spacecraft are severely restricted in size and weight. Therefore, traditional SEU immune hardware solutions which contain only SEU immune components are too heavy and large to be suitable for travel in outer space.

A variety of techniques have been utilized to prevent the corruption of data stored in a memory cell and processed in a digital circuit when the cell or circuit is struck by a charged particle. For example, U.S. Pat. No. 5,111,429, issued May 5, 1992, to Sterling R. Whitaker entitled SINGLE EVENT UPSET HARDENING CMOS MEMORY CIRCUIT, discloses the design of single event upset (SEU) immune static RAM cells. In addition, U.S. Pat. No. 5,418,473, issued May 23, 1995, to John Canaris entitled SINGLE EVENT UPSET IMMUNE LOGIC FAMILY, discloses a complete logic family which is single event upset immune. The SEU immune RAM cells and logic family, described in U.S. Pat. Nos. 5,111,429 and 5,418,473, require substantial, additional hardware to achieve SEU immunity compared to equivalent non-SEU immune circuits. These patents are incorporate by reference. Unfortunately, the techniques utilized in the prior art to ensure that memory cells and circuits are SEU immune require substantial additional hardware.

Figure 1:
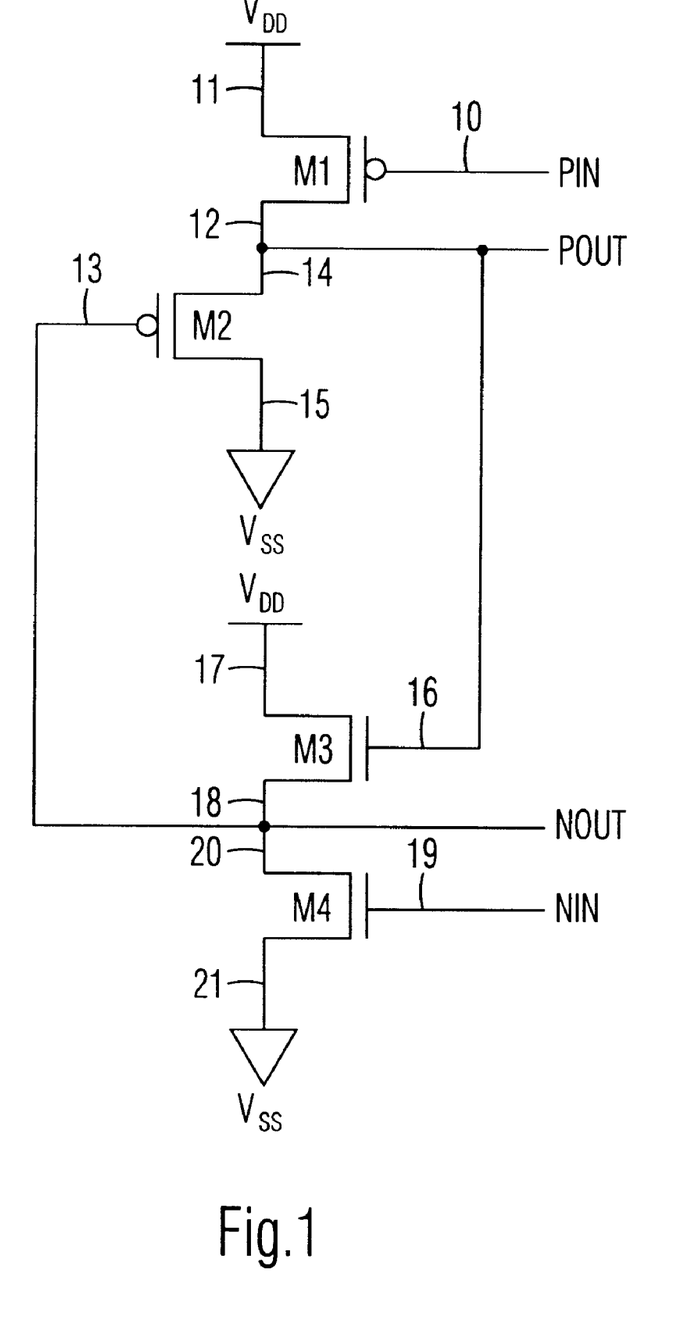
FIG. 1 illustrates a transistor level logic diagram of a prior art SEU immune inverter.

For example, FIG. 1 illustrates the complexity of a transistor level logic diagram of an SEU immune inverter as described in U.S. Pat. No. 5,418,473. The inverter includes two transistor networks, a p-channel network and an n-channel network. The p-channel network is comprises transistors M1 and M2 and the n-channel network is comprised of transistors M3 and M4. A p-channel input PIN is coupled to the gate 10 of the transistor M1 to control the transistor M1. A drain 11 of the transistor is coupled to the power supply VDD. A drain 14 of the transistor M2 is coupled to a source 12 of the transistor M1 and also to an output POUT. A source 15 of the transistor M2 is coupled to the ground VSS.

An n-channel input NIN is coupled to a gate 19 of the transistor M4 to control the transistor M4. A source 21 of the transistor M4 is coupled to the ground VSS. A source 18 of the transistor M3 is coupled to a drain 20 of the transistor M4, a gate 13 of the transistor M2 and an output NOUT. A gate 16 of the transistor M3 is coupled to the source 12 of the transistor M1, the drain 14 of the transistor M2 and the output POUT. A drain 17 of the transistor M3 is coupled to the power supply VDD.

The p-channel and n-channel networks are cross coupled. In particular, the n-channel output NOUT is coupled to control the gate 13 of the p-channel load transistor M2. Also, the p-channel output POUT is coupled to control the gate 16 of the n-channel load transistor M3. The load transistors M2 and M3 are sized to be weak in comparison to the logic transistors M1 and M4.

All devices used in the SEU immune inverter are enhancement mode transistors. The logic family according to SEU immune inverter will operate with any type of transistor including enhancement, depletion or native MOS. The inverter is a two input/two output logic device with the input PIN driving only p-channel devices and the input NIN driving only n-channel devices. The output node POUT can provide a source of logic "1"'s which cannot be upset and the output node NOUT provides a source of logic "0"'s which cannot be upset. The transistor M2 is sized to be weak compared to the transistor M1 and the transistor M3 is sized to be weak compared to the transistor M4.

When the inputs to the inverter are a logic "0", the outputs POUT and NOUT are at a logic "1". In this state, only the output NOUT can be corrupted by an upset. If the output NOUT is hit, driving the node to a logic "0", the transistor M2 will turn on but cannot overdrive the transistor M1. The output POUT will remain at a logic "1", the transistor M3 will remain on, pulling the output NOUT back up to a logic "1". Conversely, if the inputs PIN and NIN are a logic "1", the outputs POUT and NOUT will be at a logic "0" and only the output POUT can be upset. If the output POUT is hit, driving the node to a logic "1", the transistor M3 will turn on but because it is weak compared to the transistor M4, the output NOUT will remain pulled down to a logic "0".

Further, according to the prior art, U.S. Pat. No. 5,418,473, SEU immune logic gates are not limited to inverters. It is known in the art that SEU immune NAND gates, NOR gates, AndNor gates, and OrNand gates can be created using the same technique for creating the above-described SEU immune inverter. In general, an SEU immune logic gate, implemented with the above technique, requires 2n+2 transistors, n being the number of gate inputs. In comparison, classical CMOS design requires 2n transistors to implement a gate. A complex circuit that is created from many logic gates which needs to be SEU immune will require many more transistors and traces. For a circuit to be completely SEU immune, each logic gate used within the circuit will require two additional transistors when compared to classical MOS design. The additional transistors will increase the power consumption, increase the number of traces, increase the package size and weight, and add to the complexity of the circuit.

What is needed is a circuit which has the properties of being SEU immune without suffering the drawbacks of extra weight and size due to additional hardware found in prior art SEU immune circuits.

SUMMARY OF THE INVENTION

The present invention provides an SEU immune solution which minimizes the disadvantages of the increased transistor count and hence weight and size of prior art SEU immune circuits. In the present invention, the SEU immune solution can comprise two portions. First, a control portion can be comprised of SEU tolerant electronics as described in the prior art. A processor comprises the second portion and is preferably not SEU immune. The present invention makes it unnecessary for both portions of the circuit to be comprised of SEU tolerant logic in order for the output of the present invention to be SEU tolerant.

The SEU tolerant control portion directs the incoming data, directs the functions of the processor, and preferably stores the processor output. The control portion is immune to charged particles and therefore will operate correctly even in a charged particle environment such as outer space. The size of the SEU control portion is larger in comparison to an equivalent non-SEU tolerant logic control portion. However, since the controller portion contains fewer logic gates and is small relative to the total circuit size, the overall impact in size and weight of utilizing SEU tolerant logic in the controller is small compared to a non-SEU tolerant circuit.

The processor, directed by the control portion, receives the input and creates the output. In order to save space and reduce weight of the overall circuit, the processor portion of the circuit preferably comprises only non-SEU tolerant logic. Even though the processor portion of the circuit utilizes non-SEU tolerant logic, the output of the circuit is SEU tolerant. To ensure that the output of the circuit is SEU tolerant, the present invention employs time redundancy to verify the integrity of the output; the steps of the processor are repeated until the output is determined correct by comparing the stored output values in the control portion. Because the present invention utilizes time redundancy, the processor is able to use non-SEU tolerant logic.

In particular, the present invention is especially well suited for outer space travel since the present invention will not be upset by SEUs includes fewer transistors and retains a small package size and light weight.

DETAILED DESCRIPTION OF THE PREFERRED EMBODIMENT

A combination of an SEU immune controller and a non-SEU immune processor provides the benefits of a more compact design and also fewer transistors in the entire circuit when compared to a circuit utilizing only SEU tolerant components. Further, a time redundancy scheme can be utilized to ensure that the result from the combination of SEU immune components and non-SEU immune components results in an overall SEU tolerant system.

Figure 2:
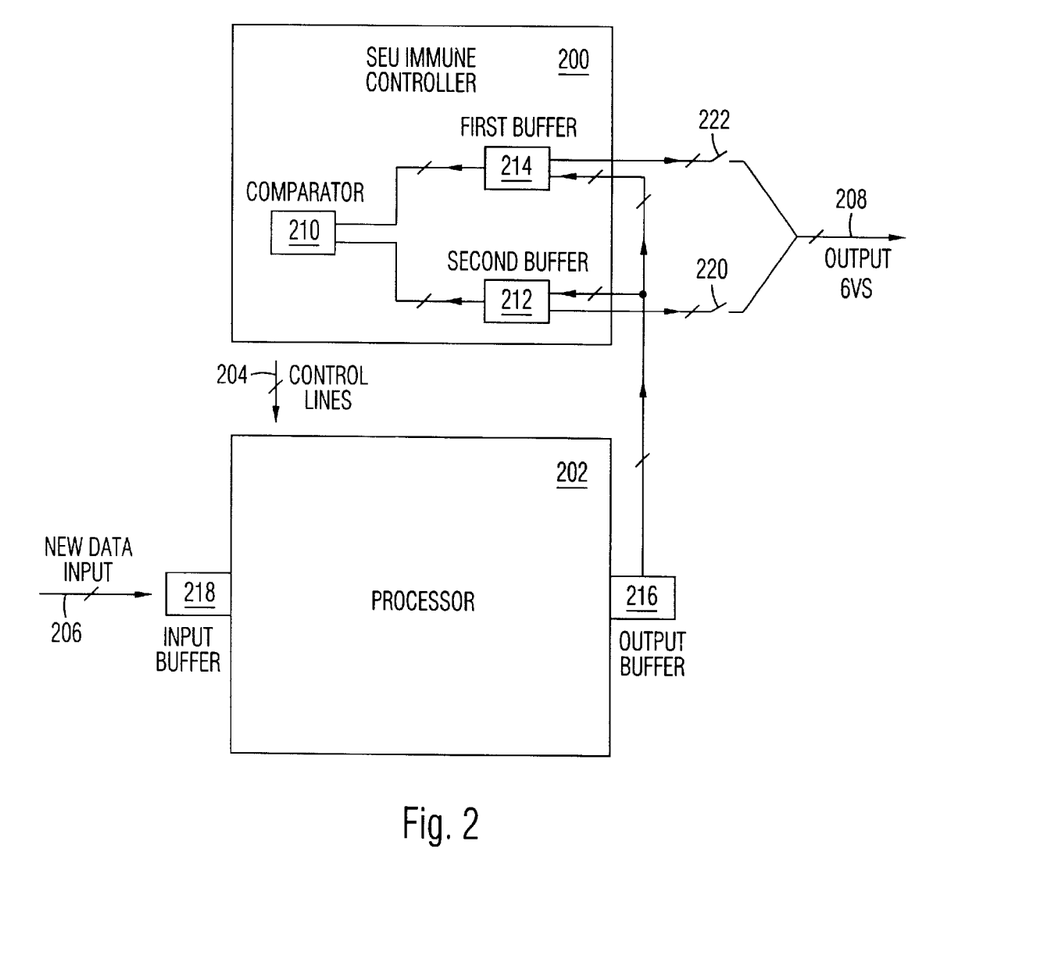
FIG. 2 illustrates a block diagram of a first embodiment of the present invention.

A block diagram of a first embodiment of the present invention is illustrated in FIG. 2. An SEU immune controller 200 is coupled to a non-SEU immune processor 202 by a plurality of control lines 204. The processor 202 relies on the controller 200 to provide accurate and un-corrupted instructions since only the controller 200 is SEU immune. The processor 202 is coupled to a new data input line 206 which provides the processor 202 with new data. Coupled between the processor 202 and the new data input line 206, an input buffer 218 receives and holds the new data from the new data input line 206. Now the processor 202 can access the new data from the input buffer 218 and process the new data. After the processor 202 is finished processing the new data, a result from the processing operation is produced. Next, the processor 202 can deposit the result into an output buffer 216 which is coupled to the processor 202. When the result reaches the output buffer 216, the processor 202 is no longer active until directed by the controller 200.

The controller 200 can control functions of the time redundancy implementation to ensure that the result from the processor 202 is accurate. The controller 200 includes a first buffer 212 and a second buffer 214 which are both coupled to the output buffer 216. Within the controller 200, a comparator 210 is coupled to both the first buffer 212 and the second buffer 214. In this embodiment, the first buffer 212 and the second buffer 214 are both constructed of SEU immune logic. Further, the result in the output buffer 216 can selectively be directed to either the first buffer 212 or the second buffer 214.

The comparator 210 preferably is constructed of SEU tolerant hardware, or software which utilizes a portion of the SEU immune controller 200, or a combination of both the SEU tolerant hardware and the software. Two sequential results are compared; if equal, the results are presumed correct. After the comparator 210 is satisfied that the result from the processor is correct, an output bus 208 can selectively obtain the result from either the first buffer 212 or the second buffer 214. A switch 222 is coupled in series between the first buffer 214 and the output bus 208, and a switch 220 is coupled in series between the second buffer 212. The controller 200 can close the switch 222 or the switch 220 to allow the output bus 208 to obtain a correct result selectively from either the first buffer 214 or the second buffer 212, respectively. In the alternative, the result from either the buffer 212 or 214 can be coupled to the output bus 2087. Because the results stored in both the buffers should be the same before the result can be coupled to the output bus 208 it is not important which buffer is so coupled.

Figure 3:
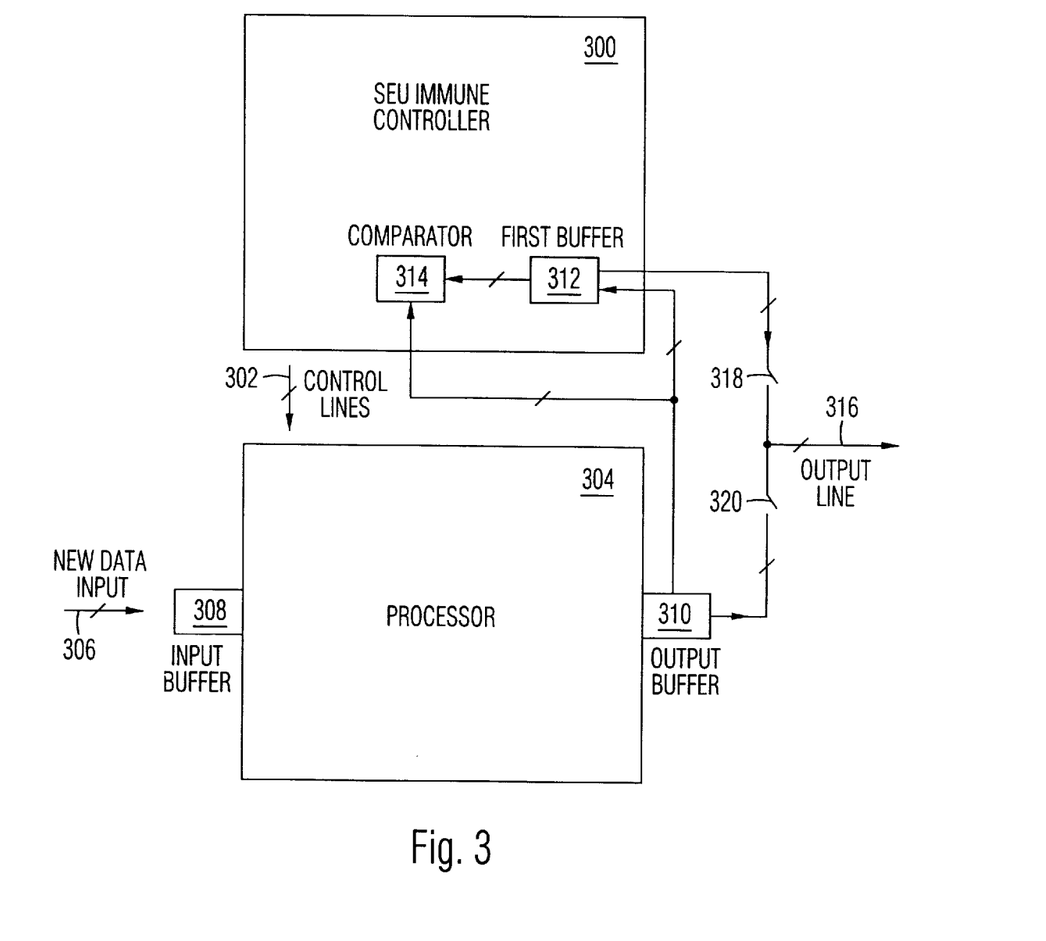
FIG. 3 illustrates a block diagram of a second embodiment of the present invention.

A block diagram of a second embodiment of the present invention is illustrated in FIG. 3. Similar to the first embodiment in FIG. 2, a SEU immune controller 300 is coupled to a non-SEU immune processor 304 by a plurality of control lines 302. Since only the controller 300 is SEU immune, the processor 304 relies on the controller 300 to provide accurate instructions. As with the first embodiment in FIG. 2, an input buffer 308 is coupled between a new data input line 306 and the processor 304. When directed by the controller 300, the processor 304 can receive new data which is stored in the input buffer 308. Similar to the processor 202 in the first embodiment, this processor 304 also processes the new data and a result is formed. The result is stored in an output buffer 310 which is coupled to the processor 304.

The controller 300 ensures that the result from the processor 304 is correct through time redundancy. A first SEU immune buffer 312 is coupled within the controller 300. A comparator 314 is also coupled within the controller 300 and is coupled to both the first buffer 312 and the output buffer 310. The comparator 314 is preferably constructed from SEU immune hardware, software which utilizes a portion of the SEU immune controller 300, or a combination of both the hardware and the software. An output bus 316 is coupled to both the output buffer 310 and the first buffer 312. A result from a first attempt of a predetermined operation from the processor 304 is stored in the buffer. A results from a second attempt is compared to that result. Once the result is determined to be correct, the output bus 316 can selectively obtain a correct result from either the output buffer 310 or the first buffer 312. Switch 318 is coupled in series between the first buffer 312 and the output bus 316, and switch 320 is coupled in series between the output buffer 310 and the output bus 316. The controller 300 can close the switch 318 or the switch 320 to allow the output bus 316 to obtain a correct result from either the first buffer 312 or the output buffer 310, respectively. Preferably, the correct result can be obtained from the first buffer 312 since the first buffer 312 is SEU immune and will protect the correct result from corruption whereas the output buffer 310 is not SEU immune.

Figure 4:
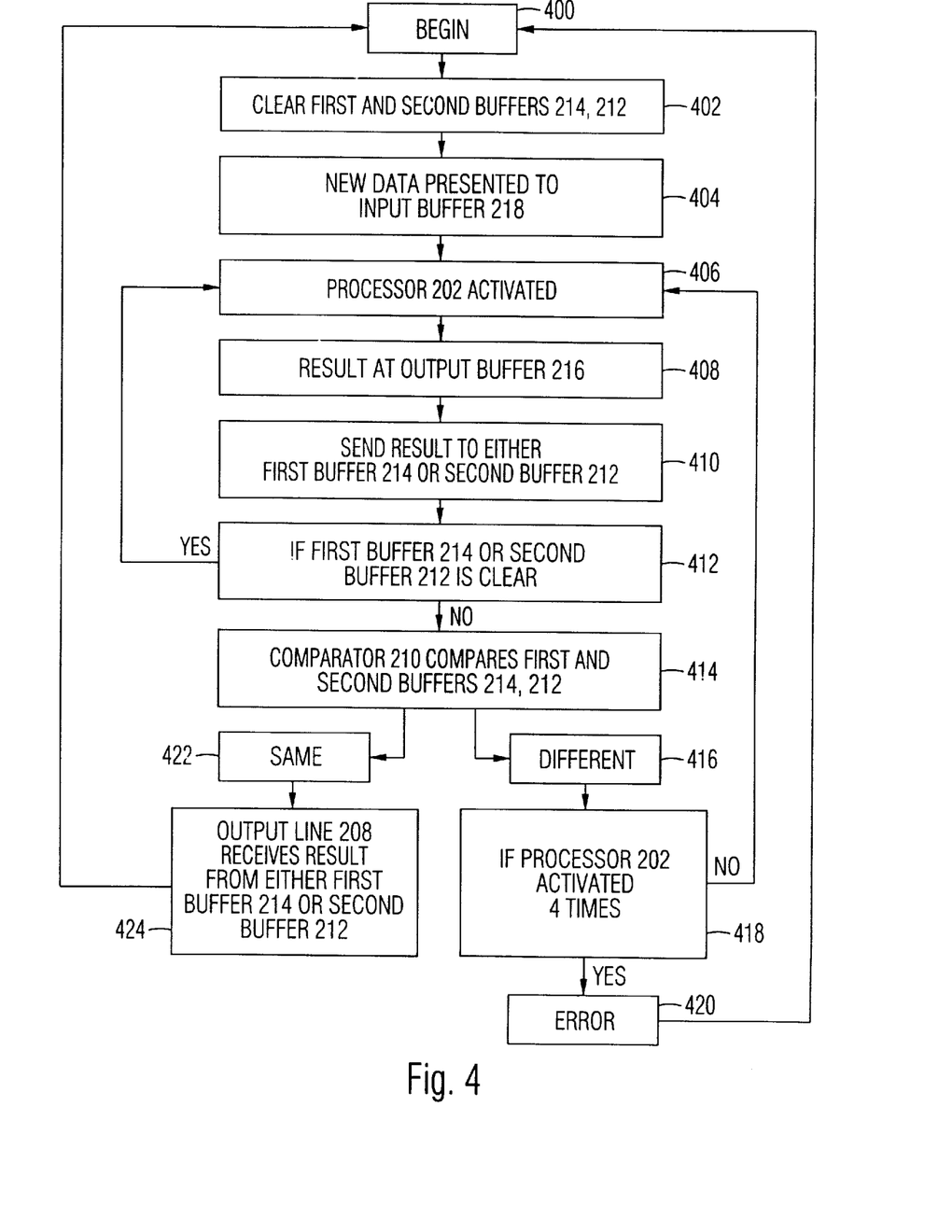
FIG. 4 illustrates a flow chart describing the first embodiment of the present invention.

FIG. 4 illustrates a step by step process which can be implemented by the first embodiment of the present invention as shown in FIG. 2. The process begins at a step 400, and then proceeds to a step 402 where the controller 200 clears the first buffer 214 and the second buffer 212 of any existing data. It is possible to eliminate the step of clearing so long as the comparison step is properly synchronized to the data acquisition steps. Next, at a step 404, new data from the new data input line 206 is received into the input buffer 218. Then at a step 406, the processor 202 is activated, and the processor 202 obtains a result which is received by the output buffer 216 at a step 408.

Next, at a step 410, the controller 200 selects the first buffer 214 and stores the result which is presently stored in the output buffer 216. Concurrently, an operation counter is incremented. After the step 410 is completed, the processor repeats the operation and stores the result in the second buffer 212. Concurrently, the operation counter is incremented. In the step 414, the comparator 210 compares the result stored in the first buffer 214 to the result stored in the second buffer 212. If the comparator 210 finds a match, then the process continues to a step 422, otherwise the process proceeds to a step 416. If a match is found the process proceeds from the step 422 to a step 424 where the output bus 208 receives a correct result from either the first buffer 214 or the second buffer 212. After the step 424, the process returns to the step 400 at the beginning.

If no match is found, the process continues from the step 416 to a step 418 where the controller 200 checks the operation counter to determine whether the operation has been performed more than a predetermined number times since the step 400 in the beginning. In the preferred embodiment, the predetermined number of times is four. If the processor 202 has not been activated more than the arbitrary predetermined number of times (4 times or more for this particular case), then we return to the step 406 where the processor 202 is activated and utilizes the data already stored in the input buffer 218. However, if the processor 202 has been activated more than the arbitrary predetermined number of times (4 times or more for this particular case), we then proceed to a step 420 where an error in the process is determined. From the step 420, we return to the step 400 in the beginning. If an error has occurred at the step 420, the data stored in the input buffer 218 is effectively discarded as the process returns to the step 400 in the beginning.

Figure 5:
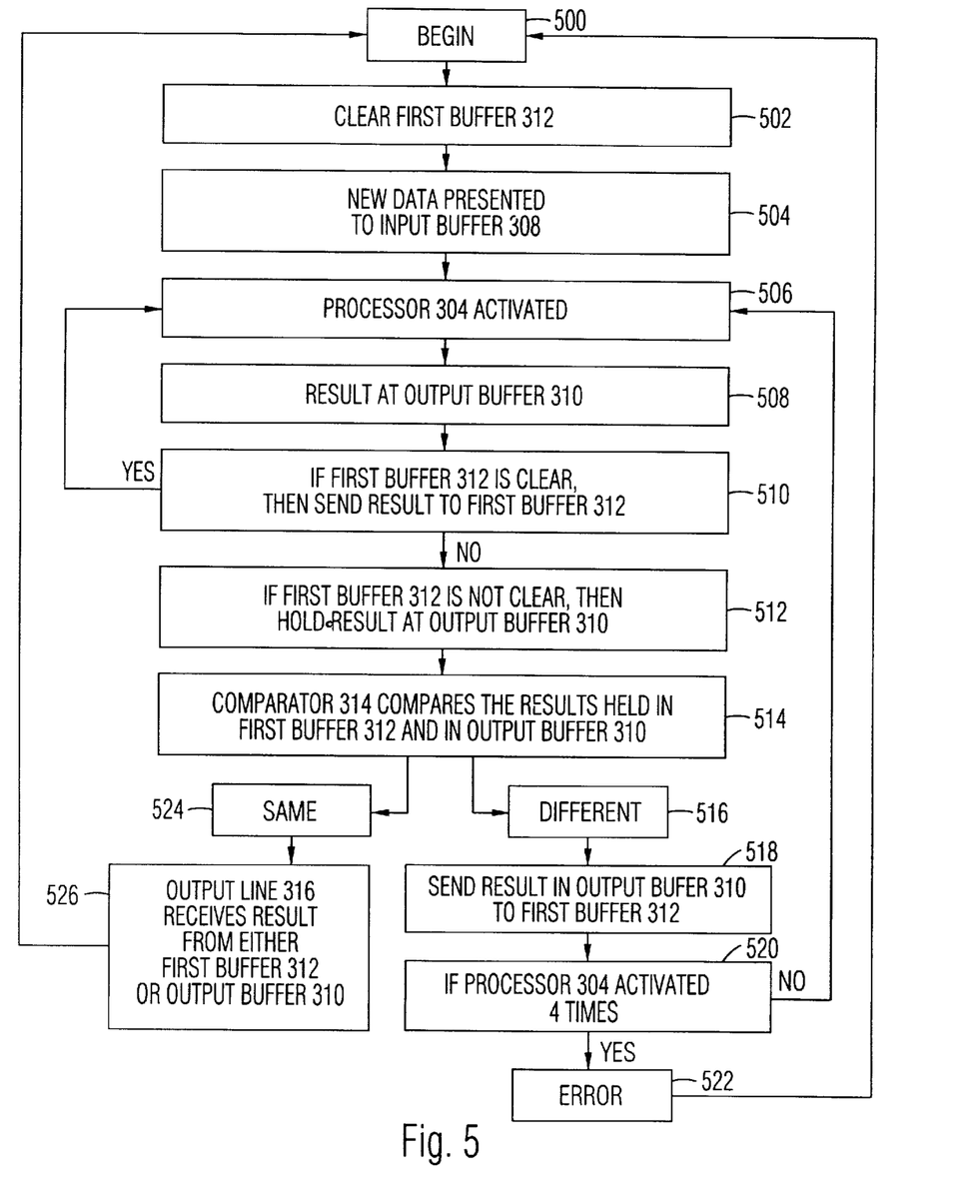
FIG. 5 illustrates a flow chart describing the second embodiment of the present invention.

FIG. 5 illustrates a step by step process which can be implemented by the second embodiment of the present invention as shown in FIG. 3. The process begins at a step 500, and then proceeds to a step 502 where the controller 300 clears the first buffer 312 from any existing data. Next, at a step 504, new data from the new data input line 306 is received into the input buffer 308. Then at a step 506, the processor 304 is activated, and the processor 304 obtains a result which is received by the output buffer 310 at a step 508.

Next, at a step 510, the controller 300 check if the first buffer 312 is clear. If the first buffer is clear, then the result stored in the output buffer 310 is sent to the first buffer 312, and the process returns to the step 506 where the processor 304 utilizes the data stored in the input buffer 308 to obtain another result which is stored in the output buffer 310. However, if the first buffer 312 is not clear, then we proceed to a step 512 where the result located at the output buffer 310 is held in that location.

Following the step 512, the comparator 314 compares the results held in the first buffer 312 and the output buffer 310 in a step 514. If the results match, then we proceed to a step 524, otherwise we proceed to a step 516. The step 524 flows into a step 526 where the output bus 316 receives a correct result from either the first buffer 312 or the output buffer 310. It would be preferable to receive the correct result from the first buffer 312, because the first buffer 312 would preferably be SEU immune.

If the results do not match, the step 516 flows into a step 518 where the result held in the output buffer 310 is sent to the first buffer 312. Next, at a step 520, the controller 300 checks if the processor 304 has been activated more than an arbitrary predetermined number of times (4 times or more for this particular case). If the processor 304 has not been activated more than the arbitrary predetermined number of times (4 times or more for this particular case), then we return to the step 506 where the processor 304 is activated and utilizes the data already stored in the input buffer 218. However, if the processor 304 has been activated more than the arbitrary predetermined number of times (4 times or more for this particular case), then we proceed to a step 522 where an error in the process is declared. After the step 522, we return back to the step 500 in the beginning. If an error has occurred at the step 522, the data stored in the input buffer 308 is effectively discarded as the process returns to the step 500 in the beginning.

Figure 6:
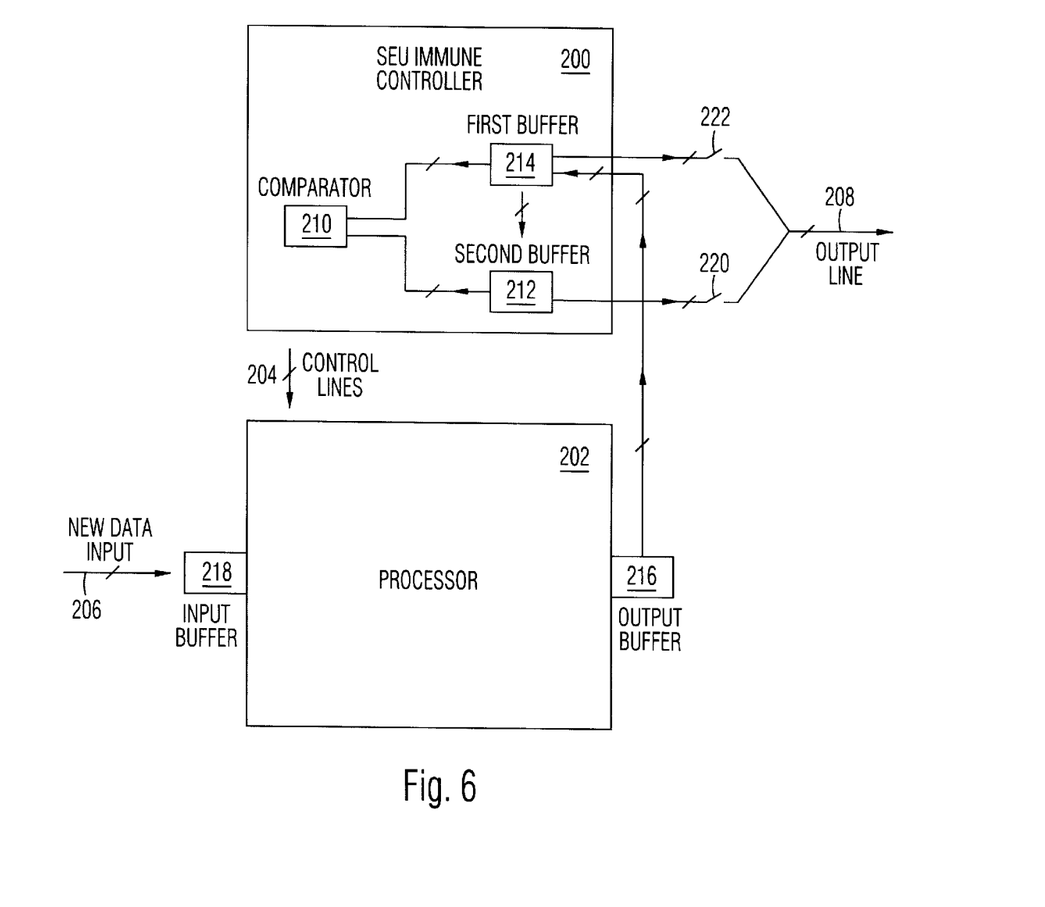
FIG. 6 illustrates a block diagram of a third embodiment of the present invention.

FIG. 6 illustrates a diagram of a third embodiment of the present invention. FIG. 6 utilizes the same components mentioned in FIG. 2. Thus, to simplify the diagram of the third embodiment, the same reference numbers utilized in FIG. 2 are also utilized in FIG. 6. In fact, most of the components found in FIG. 6 are configured in the same manner as found in FIG. 2 with the exception of the second buffer 212. As depicted in FIG. 6, the data path connections of the second buffer 212 differ from FIG. 2. In FIG. 6, the second buffer 212 is not directly coupled to the output buffer 216. Further, the second buffer 212 is directly coupled to the first buffer 214.

Figure 7:
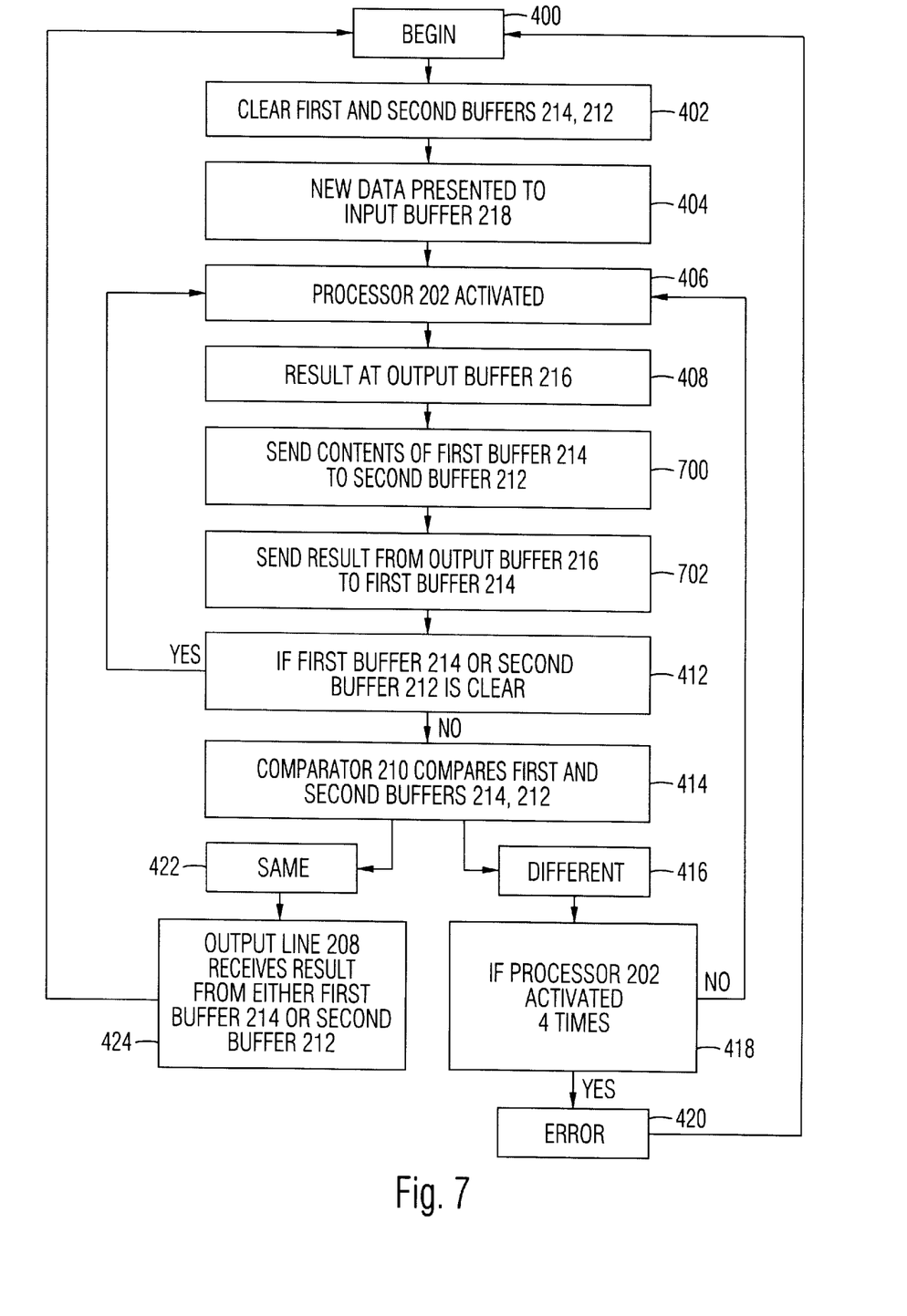
FIG. 7 illustrates a flow chart describing the third embodiment of the present invention.

FIG. 7 describes a process which can be implemented by utilizing the diagram found in FIG. 6. The process of FIG. 7 is related to the process described in FIG. 4. In fact, most of the steps found in FIG. 4 are identical to the steps found in FIG. 7 with an exception of the step 410 found in FIG. 4. The step 410, of FIG. 4, is replaced with steps 700 and 702 in FIG. 7. Just as in FIG. 4, in FIG. 7, the step 408 retains the result from the processor 202 at the output buffer 216. Instead of proceeding to the step 410 as found in FIG. 4, we proceed to a step 700 in FIG. 7. At the step 700, data stored in the first buffer 214 is sent to the second buffer 212. Next, at a step 702, the result at the output buffer 216 is sent to the first buffer 214. After the step 702, we proceed to the step 412 wherein the step 412 in both FIGS. 4 and 7 are the same.

In the processes which are illustrated in FIGS. 4, 5, and 7, a comparator compares two results labeled as a first result and a second result which are created from a same processor. If the first result and the second result match, then the results are designated as correct. However, if the two results do not match, then the processor creates a third result. Then, the comparator compares the second result and the third result, and if the results match the results are correct. The processor can continue to generate additional results and the comparator can continue to compare each additional result with a most recent prior result until there is a match or the process is terminated. More simply stated, the processes in FIGS. 4, 5, and 7 consider the results as being correct when two consecutive results match. Further, if the results do not match, then the most recent result can be used in the next comparison.

Figure 8:
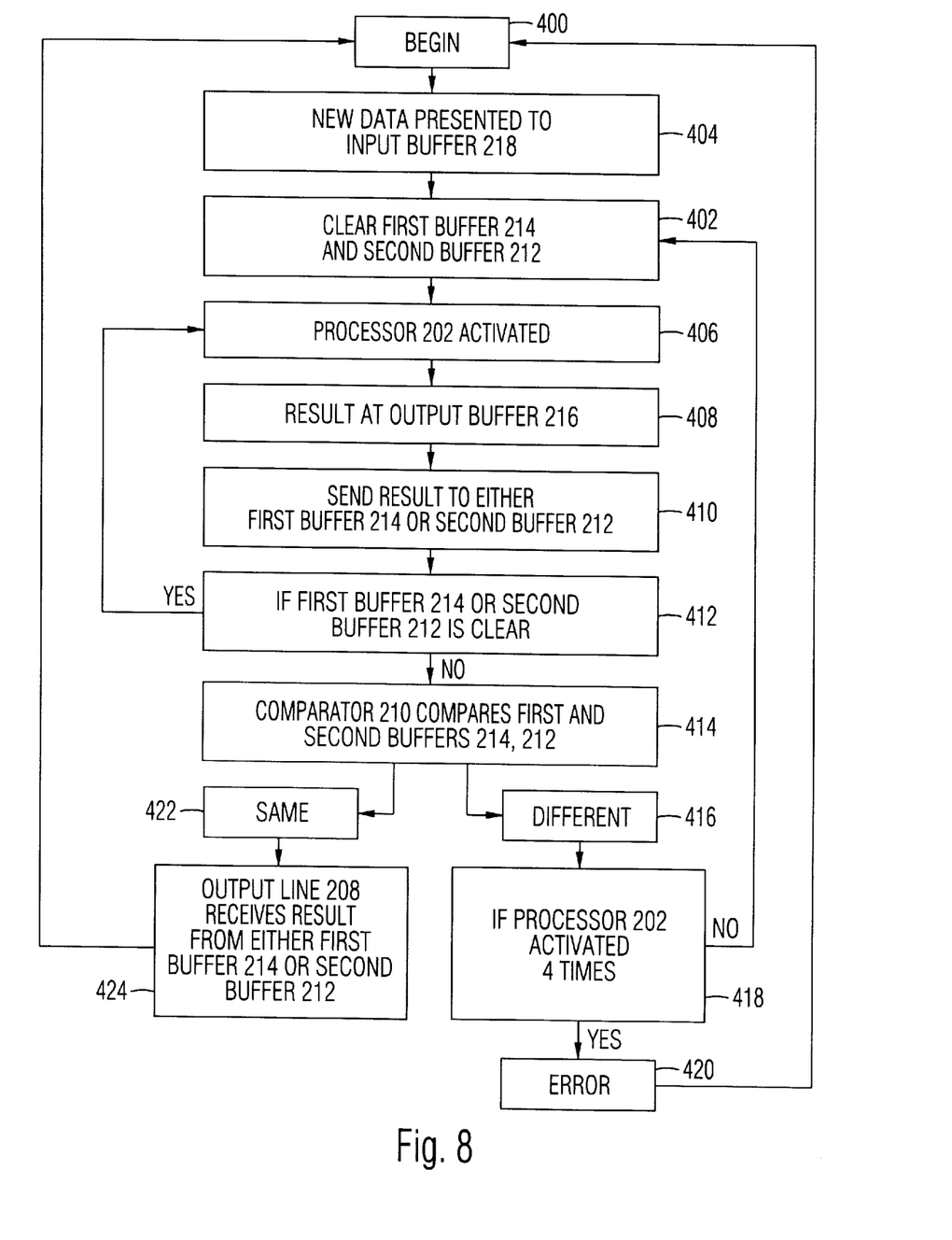
FIG. 8 illustrates a flow chart describing a fourth embodiment of the present invention.

While the processes described in FIGS. 4, 5, and 7, can determine a correct result, there may be instances where a higher degree of accuracy and protection from a SEU is required. FIG. 8 illustrates a fourth embodiment of the present invention that ensures a higher degree of accuracy while utilizing the steps shown in FIG. 4. Instead of confirming a correct result simply when two consecutive results match as shown in FIGS. 4, 5, and 7, FIG. 8 demonstrates that when two results do not match, these two results cannot be used again in subsequent comparisons. In effect, FIG. 8 requires that after two results do not match, two new results are created for a next comparison. Further, the fourth embodiment which is illustrated in FIG. 8 can be applied to any of the described block diagrams illustrated in the first, second, or third embodiments found in FIGS. 2, 3, and 6, respectively.

To eliminate confusion, the steps in FIG. 8, which correspond to the same steps in FIG. 4, share the same reference numbers used in FIG. 4. In FIG. 8, the process starts with the step 400 just as in FIG. 4. However, in FIG. 8, the step 404 follows the step 400 where new data is presented to the input buffer 218. Next, the step 402 clears the first buffer 214 and the second buffer 212. The step 406 where the processor 202 is activated follows the step 402. The process described in FIG. 8 continues similarly to the process described in FIG. 4 until the step 418. To reach the step 418 in FIGS. 4 and 8, the comparison of the result stored in the first buffer 214 and the second buffer 212 do not match. However, in FIG. 8, if the processor 202 has not been activated four times or more at the step 418, then we return to the step 402 where the first buffer 214 and the second buffer 212 are both cleared. It is clear that the process, as described in FIG. 8, does not allow any one of a pair of results to be used again in subsequent comparisons once the pair of results does not match.

The SEU immune controller of the above embodiments can be created using discrete logic components that are SEU immune and known in the art. Returning back to the prior art in FIG. 1, SEU immune inverter gate is shown. Building on FIG. 1, it is known in the art that SEU immune NAND gates, NOR gates, AndNor gates, and OrNand gates can be created using the same technique for creating the above-described SEU immune inverter. Further, it would be apparent to a person skilled in the art how to build the present invention given the prior art, the block diagrams shown in FIGS. 2, 3, and 6, and the flow charts shown in FIGS. 4, 5, 7, and 8.

The processors 202 and 304 as shown in FIGS. 2, 3, and 6 can be configured to execute many different functions.

All the buffers described in FIGS. 2, 3, and 6, can be constructed to hold a single bit or a plurality of bits. It is known in the art that a buffer holding a single bit can be constructed of a data register. It is also known in the art that a serial shift register or a parallel load register can serve as a buffer holding multiple bits. Further, both comparators 210 and 314 can be either serial load comparators or parallel load comparators. The data lines displayed in FIGS. 2, 3, and 6, each have a hash mark through each data line to indicate that there can be a single data line or a plurality of data lines. Accordingly, it is clear that the present invention can handle a single data bit or multiple data bits at one time. Further, to avoid unnecessarily complicating the block diagrams of FIGS. 2, 3, and 6, control lines from the controller to each of the buffers and comparators have been omitted.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. A method of preventing a single event upset occurrence from affecting an output signal of a circuit by:
  a. presenting input data to the circuit which provides a first result;
  b. presenting the input data to the circuit a second time which provides a second result;
  c. providing the output signal if the first result and the second result agree; and
  d. repeating steps (a) through (c) until the output signal is provided.

2. The method as claimed in claim 1 wherein the step of repeating steps (a) through (c) is performed only once.

3. The method as claimed in claim 1 wherein the circuit is not comprised of single event upset tolerant logic.

4. The method as claimed in claim 1 further comprising the step of loading the first result into a buffer.

5. The method as claimed in claim 1 further comprising the step of comparing the first result with the second result.

6. The method as claimed in claim 1 further comprising the step of terminating the repeating steps (a) through (c) when one of the following has occurred: the repeating steps (a) through (c) is performed a predetermined number of times and the output signal is provided.

7. The method as claimed in claim 6 further comprising the step of providing an error message if the steps have been performed the predetermined number of times and the output signal has not been provided.

8. A method of preventing a single event upset occurrence from corrupting an output by:
   a. loading input data into a processor thereby forming a first result and subsequently loading the input data into the processor thereby forming a second result;
   b. comparing the first result and the second result;
   c. providing a selective one of the first result and the second result as the output when the first result and the second result match; and
   d. repeating steps (a) through (c) using new input data when the first result and the second result match.

9. The method as claimed in claim 8 further comprising the step of terminating the repeating steps of (a) through (c) in claim 8 after the new input data is depleted.

10. The method as claimed in claim 8 wherein when the first result and the second result do not match further comprising the steps of:
    a. reloading the input data into the processor thereby forming a selective one of the first result and the second result; and
    b. repeating the step of reloading when the first result and the second result do not match.

11. The method as claimed in claim 10 wherein when the first result and the second result do not match further comprising the step of terminating the step of repeating the step of reloading after a predetermined number of times.

12. The method as claimed in claim 8 wherein when the first result and the second result do not match further comprising the steps of:
    a. overwriting the first result with the second result thereby replacing the first result with the second result;
    b. reloading the input data into the processor thereby, subsequent to step (a), forming the second result; and
    c. repeating the steps of overwriting and reloading if the first result and the second result do not match.

13. The method as claimed in claim 12 wherein when the first result and the second result do not match further comprising the step of terminating the step of repeating the steps of overwriting and reloading after a predetermined number of times.

14. A device for preventing a single event upset occurrence from affecting an output signal of the device comprising:
    a. a non single event upset tolerant processor for processing input data again thereby forming a first result and subsequently processing the input data thereby forming a second result;
    b. a single event upset immune controller coupled to the processor wherein the controller provides a selective one of the first result and the second result as an output when the first result and the second result match; otherwise if the first result and the second result do not match, the controller directs the processor to reprocess the input data again thereby forming a selective one of the first result and the second result; and
    c. a comparator means coupled to the controller and the processor for comparing the first result and the second result.

15. The device as claimed in claim 14, wherein the controller further comprises a buffer for storing the input data.

16. The device as claimed in claim 14 wherein the comparator means is comprised of software source code.

17. The device as claimed in claim 14 wherein the comparator means is a circuit which utilizes single event upset tolerant logic.

18. The device as claimed in claim 14 further comprising a buffer which is single event upset tolerant for storing a selective one of: the first result, the second result, and both the first and the second result.

* * * * *

UNITED STATES PATENT AND TRADEMARK OFFICE
CERTIFICATE OF CORRECTION

PATENT NO. : 6,133,747
DATED : October 17, 2000
INVENTOR(S) : Kelly Cameron

It is certified that error appears in the above-identified patent and that said Letters Patent is hereby corrected as shown below:

<u>IN THE REFERENCES CITED[56]</u>

The following Other Publications need to be corrected:

Replace "T. Fujio, 'A Study of High-Definition TV System in the Future,' Iee Trans. Broadcast, vol BC-24, No. 4, pp. 347-350, 1983." with --T. Fujio, 'A Study of High-Definition TV System in the Future,' IEEE Trans. Broadcast, vol BC-24, No. 4, pp. 92-100, Dec. 1978.--

Replace "I. Reed and G. Solomon, 'Polynomial Codes over Certain Finite Fields,' J. Soc. Industrial Applied Mathematics, vol. 8, no. 2, pp. 300-304, Jun. 1996." with --I. Reed and G. Solomon, 'Polynomial Codes over Certain Finite Fields,' J. Soc. Industrial Applied Mathematics, vol. 8, no. 2, pp.300-304, Jun. 1960.--

UNITED STATES PATENT AND TRADEMARK OFFICE
CERTIFICATE OF CORRECTION

PATENT NO. : 6,133,747
DATED : October 17, 2000
INVENTOR(S) : Kelly Cameron

It is certified that error appears in the above-identified patent and that said Letters Patent is hereby corrected as shown below:

Replace "S. Whitaker, J. Canaris, and P. Owlsey, 'Custom CMOS Reed-Solomon Coder for the Hubble Space Telescope,' Proceedings of the IEEE Military Communications Conference, Monterey, CA, pp. 4.3.1-4.3.5, Oct. 1990." with --S. Whitaker, K. Cameron, G. Maki, J. Canaris, and P. Owlsey, "Custom CMOS Reed-Solomon Coder for the Hubble Space Telescope,' Proceedings of the IEEE Military Communications Conference, Monterey, CA, pp. 4.3.1-4.3.5, Oct. 1990.--

Signed and Sealed this

Twelfth Day of June, 2001

*Attest:*

NICHOLAS P. GODICI
*Attesting Officer*     *Acting Director of the United States Patent and Trademark Office*

UNITED STATES PATENT AND TRADEMARK OFFICE
CERTIFICATE OF CORRECTION

PATENT NO. : 6,133,747
DATED : October 17, 2000
INVENTOR(S) : Kelly Cameron

It is certified that error appears in the above-identified patent and that said Letters Patent is hereby corrected as shown below:

IN THE REFERENCES CITED[56]

The following Other Publications need to be corrected:

Replace "T. Fujio, 'A Study of High-Definition TV System in the Future,' IEee Trans. Broadcast, vol BC-24, No. 4, pp. 347-350, 1983." with --T. Fujio, 'A Study of High-Definition TV System in the Future,' IEEE Trans. Broadcast, Vol BC-24, No. 4, pp. 92-100, Dec. 1978.--

Replace "I. Reed and G. Solomn, Polynomial Codes over Certain Finite Fields,' J. Soc. Industrial Applied Mathematics, vol. 8, no. 2, pp. 300-304, Jun. 1996." with --I. Reed and G. Solomon, 'Polynomial Codes over Certain Finite Fields,' J. Soc. Industrial Applied Mathematics, vol. 8, no. 2, pp. 300-304, Jun. 1960.--

UNITED STATES PATENT AND TRADEMARK OFFICE
CERTIFICATE OF CORRECTION

PATENT NO. : 6,133,747
DATED : October 17, 2000
INVENTOR(S) : Kelly Cameron

It is certified that error appears in the above-identified patent and that said Letters Patent is hereby corrected as shown below:

Replace "S. Whitaker, J. Canaris, and P. Owlsey, 'Custom CMOS Reed-Solomon Coder for the Hubble Space Telescope,' Proceedings of the IEEE Military Communications Conference, Monterey, CA, pp. 4.3.1-4.3.5, Oct. 1990." with --S. Whitaker, K. Cameron, G. Maki, J. Canaris, and P. Owlsey, "Custom CMOS Reed-Solomon Coder for the Hubble Space Telescope,' Proceedings of the IEEE Military Communications Conference, Monterey, CA, pp. 4.3.1-4.3.5, Oct. 1990.--

Signed and Sealed this

Twenty-sixth Day of June, 2001

*Attest:*

NICHOLAS P. GODICI
*Attesting Officer*  Acting Director of the United States Patent and Trademark Office